United States Patent
Fietzke et al.

(10) Patent No.: US 6,620,299 B1
(45) Date of Patent: Sep. 16, 2003

(54) PROCESS AND DEVICE FOR THE COATING OF SUBSTRATES BY MEANS OF BIPOLAR PULSED MAGNETRON SPUTTERING AND THE USE THEREOF

(75) Inventors: Fred Fietzke, Dresden (DE); Klaus Goedicke, Dresden (DE); Siegfried Schiller, Dresden (DE)

(73) Assignee: Fraunhofer-Gesellschaft zur Förderung der Angewandten Forschung E.V., München (DE)

( * ) Notice: Subject to any disclaimer, the term of this patent is extended or adjusted under 35 U.S.C. 154(b) by 0 days.

(21) Appl. No.: 09/868,636

(22) PCT Filed: Dec. 27, 1999

(86) PCT No.: PCT/DE99/04132

§ 371 (c)(1),
(2), (4) Date: Jun. 27, 2001

(87) PCT Pub. No.: WO00/39355

PCT Pub. Date: Jul. 6, 2000

(30) Foreign Application Priority Data

Dec. 28, 1998 (DE) .......................... 198 60 474

(51) Int. Cl.⁷ .............................................. C23C 14/34
(52) U.S. Cl. ........................ 204/192.12; 204/192.15; 204/298.08; 204/298.18; 204/298.26
(58) Field of Search ................. 204/192.12, 192.15, 204/298.08, 298.18, 298.26, 298.11

(56) References Cited

U.S. PATENT DOCUMENTS

| | | | |
|---|---|---|---|
| 5,006,218 A | * 4/1991 | Yoshida et al. | 204/298.06 |
| 5,346,600 A | 9/1994 | Nieh et al. | |
| 5,556,519 A | * 9/1996 | Teer | 204/192.12 |
| 6,005,218 A | 12/1999 | Walde et al. | |
| 6,063,245 A | 5/2000 | Frach et al. | |
| 6,340,416 B1 | * 1/2002 | Goedicke et al. | 204/192.12 |

FOREIGN PATENT DOCUMENTS

| | | | |
|---|---|---|---|
| DE | 4438463 | 2/1996 | |
| DE | 19651615 | 7/1997 | |
| DE | 19702187 | 7/1998 | |
| DE | 19740793 | 3/1999 | |
| EP | 0583736 | 2/1994 | |
| GB | 2303380 A | * 2/1997 | ........... C23C/14/34 |

OTHER PUBLICATIONS

International Preliminary Search Report for PCT/DE99/04132 dated Apr. 6, 2001.*
Article by Teer, Technical Note: A Magnetron Sputter Ion-–Plating System, Surf. Coat. Technol., No. 39/40 (1989), pp. 565–572.
Article by Schiller et al., Society of Vacuum Coaters, 38th Annual Technical Conference Proceedings 1995, pp. 293–297.

(List continued on next page.)

Primary Examiner—Patrick Ryan
Assistant Examiner—Gregg Cantelmo
(74) Attorney, Agent, or Firm—Greenblum & Bernstein, P.L.C.

(57) ABSTRACT

Process and device for coating substrates utilizing bipolar pulsed magnetron sputtering in the frequency range between 10 and 100 kHz, wherein the device includes at least three magnetron sources. Each of the at least three magnetron sources includes a target. At least two of the targets are connected to a potential-free bipolar power supply device. The at least three targets are arranged relative to the substrates in such a way that the substrates are located at least partially inside a discharge current during a coating of the substrates. A switching device is adapted to connect the targets to the bipolar power supply device. A technological predetermined program is used for controlling the switching device. The switching device connects at least two of the targets at a time to the bipolar power supply device according to the technologically predetermined program.

23 Claims, 5 Drawing Sheets

OTHER PUBLICATIONS

Article by Bräuer et al., Proc of the 3rd ISSP, Tokyo 1995, pp. 63–70.
Article by Window and Savvides, Unbalanced DC Magnetrons as Sources . . . , J.Vac.Sci.Technol. A4 (3) 1986, pp. 453–456.

Article by Hofmann, New Multilayer PVD Coating Techniques for Cutting Tools, Surf.Coat.Technol., No. 61 (1993), pp. 326–330.

* cited by examiner

Fig.1 ; Prior Art

PROCESS AND DEVICE FOR THE COATING OF SUBSTRATES BY MEANS OF BIPOLAR PULSED MAGNETRON SPUTTERING AND THE USE THEREOF

CROSS-REFERENCE TO RELATED APPLICATIONS

The present application is a National Stage Application of International Application No. PCT/DE99/04132, filed Dec. 27, 1999. Further, the present application claims priority under 35 U.S.C. §119 of German Patent Application No. 198 60 474.2 filed on Dec. 28, 1998.

BACKGROUND OF THE INVENTION

1. Field of the Invention

The invention relates to a process and a device for the coating of substrates by way of bipolar pulsed magnetron sputtering in the frequency range of 10 kHz to 100 kHz. The invention is particularly intended to deposit layers with poor electrical conductivity or insulating layers onto substrates. Such layers are preferably used as optical, electrical, or mechanical functional layers as are needed for optical components, electrical components, or for friction-reducing and wear-retarding protective layers.

2. Discussion of Background Information

Magnetron sputtering is widely used for depositing metallic and electrically insulating layers. The recent introduction of reactive pulsed magnetron sputtering brought about significant progress, especially for the economical deposition of layers with poor electrical conductivity or insulating layers (Schiller et al., Society of Vacuum Coaters, 38th Annual Technical Conference Proceedings 1995, pages 293–297).

Processes for unipolar and bipolar pulsed magnetron sputtering are known. In unipolar pulsed magnetron sputtering, the energy is fed into the target in the form of direct current pulses. A special manner of feeding unipolar pulsed energy using several targets sputtered in a unipolar fashion is described in DE 197 02 187. Here, at least one of two magnetron electrodes is connected cathodically and at least one is connected anodically and the discharge energy is fed in a unipolar fashion during a defined period of time with a pulse frequency of 10 to 150 kHz. Then the power supply is interrupted and a polarity reversal is performed.

Particularly high process stability and the possibility of coating large areas of largely uniform surfaces can be achieved by means of reactive sputtering with a double magnetron arrangement using a bipolar pulsed power supply with a frequency for the polarity change of 10 kHz to 100 kHz. Here, it is less significant for the process whether a clocked direct current source or a medium frequency generator is selected as the type of pulsed power source.

In a double magnetron arrangement that has been introduced in the field of coating technology as a dual magnetron system or TwinMag (Bräuer et al., Proc. of the 3rd ISSP, Tokyo 1995, pages 63–70), each target of the double magnetron arrangement acts alternately as a cathode or an anode of a gas discharge burning between the targets in the rhythm of the polarity reversal. Known arrangements consist of two magnetron sources arranged parallel to one another with rectangular targets that lie in a plane or are inclined toward one another at a particular angle in the shape of a roof. The overlapping of the magnetic fields of the two magnetron sources occurring here requires special measures or devices for compensating for the uneven erosion speed of the various regions of the target. In general, however, despite these measures, target erosion occurs with greater speed in the region of the closely adjacent erosion channels than in the region of erosion channels that are more widely separated from one another. This leads to a shortening of the useful life of the cost-intensive target.

A deciding factor for the quality of the layers deposited by-means of sputtering is the plasma density, i.e., the density of charged particles in the region of the substrates. It influences the average energy of the condensing particles and thus the structure of the layers and many other physical layer characteristics. In the region near the target, the plasma density is very high during magnetron sputtering. However, it decreases very quickly in the direction of the substrates and is less by orders of magnitude in the region of the substrate.

Various processes and/or devices are known from coating technology with single magnetron sources that have the purpose of increasing the plasma density in the region of the substrates. Thus, the spatial plasma density is changed by means of asymmetrical formation of the magnetic field of the magnetron source in such a way that the plasma density is increased in the region of the substrates (Window and Savvides, Unbalanced DC Magnetrons as Sources . . . , J.Vac.Sci.Technol. A4 (3) 1986, pages 453–456).

Similar effects are achieved with magnetic fields that are produced by means of additional coils, or so-called plasma booster arrangements (Hofmann, New Multilayer PVD Coating Techniques for Cutting Tools, Surf.Coat.Technol., No. 61 (1993), pages 326–330). Arrangements with four direct current magnetron sources are also known whose magnetic field poles are arranged such that their overlapping achieves a closed magnetic field with increased plasma density in the vicinity of the substrate.

In pulsed magnetron sputtering with double magnetron arrangements, the region of higher plasma density is located near the surface of the targets, in particular also in the vicinity of the gap between the targets. The layers deposited on the substrates condense under the influence of a comparatively low plasma density and therefore have quality defects in many cases. There is no known adaptation of the methods or arrangements for displacing the region of high plasma density in the direction of the substrate to double magnetron arrangements. Of these measures, only the introduction of large-area additional coils would be conceivable to one skilled in the art. However, a higher equipment expense and only limited effectiveness could be expected.

The concentration of the plasma in the immediate vicinity of the double magnetron arrangement has a particularly disadvantageous effect when three-dimensional extended substrates or substrates that are arranged on movable holders such as rotating cages or rotating substrate receptacles with several parallel rotational axes for the purpose of even coverage are to be coated in the immediate vicinity of the double magnetron arrangement. According to the prior art, the condensation of the layers on such substrates during pulsed magnetron sputtering occurs with a plasma density that differs greatly locally and, in the case of movable substrates, with a plasma density that differs over time. Serious disadvantages in terms of layer structure and local uniformity of layer characteristics result from this.

SUMMARY OF THE INVENTION

The invention provides for a process and a device for coating of substrates by way of bipolar pulsed magnetron sputtering that guarantees high-quality deposition of the layers. In particular, substrates that are extended in three dimensions and/or substrates and groups of substrates in the form of substrate arrangements that are arranged during coating on holders, preferably movable holders, such as rotating cages or rotating substrate receptacles with several parallel rotational axes, should also be coated at high quality. Moreover, the invention also provides for applications for the process and the device according to the invention.

The invention provides for a process for coating substrates utilizing bipolar pulsed magnetron sputtering in the frequency range between 10 kHz and 100 kHz in a device which includes at least three targets, the process comprises connecting at least two targets at a time to a potential-free bipolar power supply device, sputtering the at least two targets in a bipolar manner for a predetermined period of time, changing the connecting of the at least two targets to the bipolar power supply device according to a technologically predetermined program, and arranging the at least two targets relative to the substrate in a manner such that during each of a reversing discharge, the substrates being located at least partially inside a discharge current between the targets which are active at the time.

The changing may occur one of temporally periodically and aperiodically. The predetermined period of time may comprise at least 10 polarity reversals of a bipolar magnetron discharge. The predetermined period of time may comprise between 1,000 and 100,000 polarity reversals. At least one of a material of the targets and the technologically predetermined program may be adapted to a desired layer deposition. At least one of a material of the targets and the technologically predetermined program may be adapted to a desired coating task. The substrates may comprise at least one of an optical, an electrical, and mechanical component or tool.

The invention also provides for a device for coating substrates utilizing bipolar pulsed magnetron sputtering in the frequency range between 10 and 100 kHz. The device comprises at least three magnetron sources. Each of the at least three magnetron sources comprises a target. At least two of the targets are connected to a potential-free bipolar power supply device. The at least three targets are arranged relative to the substrates in such a way that the substrates are located at least partially inside a discharge current during a coating of the substrates. A switching device is adapted to connect the targets to the bipolar power supply device. A technological predetermined program is used for controlling the switching device. The switching device connects at least two of the targets at a time to the bipolar power supply device according to the technologically predetermined program.

The at least three targets may comprise at least four targets. At least two of the at least four targets may be arranged on one side of the substrates and wherein at least two of the at least four targets are arranged on another side of the substrates. The at least three targets may be arranged to surround the substrates. At least one of the at least three targets and the substrates may be adapted to be movable. The at least three targets may comprise four targets, wherein two of the four are arranged on opposite sides of the substrates, and one of the two targets on each side of the substrates may be adapted to be simultaneously connected to the bipolar power supply device. At least one of the at least three targets may be connected to the bipolar power supply device and at least two of the at least three targets may be connected to the switching device. At least one of the at least three targets may comprise a central target which is centrally disposed and at least two of the at least three targets may comprise peripheral targets which are peripherally arranged, whereby the substrates are disposed between the central target and the peripheral targets. The central target may be at least one of tube-shaped, connected to the bipolar power supply device, and a centrally rotatable magnet arrangement. The central target may be rotatable. The at least three magnetron sources may be spaced apart such that their corresponding magnetic fields do not significantly influence one another. The device may further comprise a device arranged to surround the at least three magnetrons. The device arranged to surround the at least three magnetrons may comprise one of a grounded screen and potential-free screen. The device arranged to surround the at least three magnetrons may protrude into an open area between a target plane and the substrates. The substrates may comprise at least one of an optical, an electrical, and mechanical component or tool.

The invention also provides for a device for coating substrates utilizing bipolar pulsed magnetron sputtering in the frequency range between 10 and 100 kHz. The device comprises a bipolar power supply. A switching device is coupled to the bipolar power supply. A program is adapted to control the switching device. At least three magnetron sources are included. At least two of the at least three magnetron sources is coupled to the switching device. At least one of the at least three magnetron sources are coupled to one of the switching device and the bipolar power supply. Each of the at least three magnetron sources comprises a target. The switching device connects at least two of the targets at a time to the bipolar power supply according to the program.

According to the invention three or more targets are arranged relative to the substrates in such a way that the substrates are located essentially in the region of high plasma density when at least two of the targets are respectively connected to the target terminals of a bipolar power supply device and, in the course of the coating process, the specific targets connected to the power supply device are changed according to a technologically predetermined program.

Here, it has been shown that bipolar pulsed magnetron sputtering in the frequency range between 10 kHz and 100 kHz can also be operated in a stable manner with magnetron sources that are arranged at a large spatial distance from one another. In this operating mode, the plasma is extended to a large-area region between the magnetron sources and also has a high density in the region of the substrates arranged there. If the sputtering process is performed with more than two magnetron sources and the selection and switching time of the targets connected to the terminals of the power supply device is controlled by way of an appropriate program, then an appropriate, preferably uniform, distribution of the plasma density in the entire three-dimensional space containing the substrates can be achieved averaged over time. Advantageously, the program can be structured in such a way that, at the same time, several targets are connected to the positive pole and several other targets are connected to the negative pole. Compared to bipolar pulsed magnetron sputtering using a double magnetron arrangement according to the prior art, layers can be deposited on the substrates in this manner with higher plasma activation. They have an improved structure, for example, a higher density, greater crystallinity, and a higher isotropy of crystal growth. This results in advantageous optical, electrical, and mechanical characteristics of the layers.

Depending on the technological needs, it can also be useful for the program for switching the targets connected to the power supply device to be set in a temporally aperiodic manner. One example of this is the deposition of layer systems by way of bipolar pulsed magnetron sputtering when these systems include several partial layers, of which at least two contain one and the same metallic component. In this manner, the equipment expense can be reduced by reducing the total number of targets required. However, even more crucial is the increase in layer quality that results from the further increase in plasma thickness as a result of the spatial concentration.

Furthermore, it can be useful for the program to contain temporally periodic switching. This process is especially appropriate for the deposition of layers on substrate arrangements that are extended over very large areas. If, for example, the connection of two given targets with the bipolar power supply device is maintained only for a period of time in which the position of the substrates changes only insignificantly, then a maximal homogenization of the plasma density results.

A particular advantage of the process lies in the fact that the discharge voltage of the bipolar magnetron discharge according to the invention as compared to the discharge voltage of a double magnetron arrangement according to the prior art under comparable conditions of the target material, gas composition, and gas pressure at the same energy supply can be substantially increased by increasing the impedance of the gas discharge. The increase can lie between 5 and 25%. Thus, a higher average energy of the particles and a further increase in plasma activation in layer condensation is achieved.

If one layer, preferably of a metal compound that has poor electrical conductivity or is insulating, is to be deposited, then the process is performed using at least three magnetron sources with targets made of the same metal.

During deposition of a layer system composed of partial layers in which at least one metallic component is the same, magnetron sources are used with targets of different materials. Here, the program for switching is structured in such a way that, in addition to homogenization of the plasma distribution, the desired composition and thickness of the partial layers is ensured.

If the extension of the substrates is considerably lower in one dimension than in the other two dimensions, it is useful to arrange the targets of the magnetron source in two levels, with the substrates being located between the targets and at least two targets located across from one another being sputtered in a bipolar manner.

For the coating of other substrates, in particular when they are to be coated on all sides and are moved for this purpose, a device is useful in which at least two of the magnetron sources are across from one another. A particularly useful device contains at least three magnetron sources that are arranged in a circle around the substrates at approximately the same angular distance from one another. The angle a between the target normals then amounts to 360°/k, where k is the number of magnetron sources.

Usefully, one device includes magnetron sources whose targets are surrounded by a grounded or potential-free screen that extends into the open space between the target plane and the substrates. With the aid of such screens, the impedance of the gas discharge is increased, an increase of the average energy of the condensed particles is achieved, and the plasma density in the region of the substrate is increased It is useful for the device to be structured in such a way that such a large distance between the individual magnetron sources results and their magnetic fields do not substantially influence one another. This characteristic in connection with an appropriate switching program ensures a largely uniform sputtering of the target on all regions of the erosion channels and thus a long service life of the target.

By way of a suitable structure of the switching program, it can be achieved that, on the average, each target is connected to other targets for an equal length of time and thus all targets are essentially evenly sputtered.

Another useful device with substrates arranged in the shape of a ring contains magnetron sources that are arranged around the substrates in a circle and whose target normals point in the direction of the substrate. The arrangement can furthermore have one or more magnetron sources positioned in the center of the substrate arrangement, whose target normals also point in the direction of the substrate. By way of the switching program, it is ensured that, at least for portions of the coating time, one or more outer magnetron sources and one or more inner magnetron sources at the same time are acting together with the pulsed power supply device.

The device mentioned above can also advantageously be modified such that a magnetron source having a tube-shaped target and a magnet arrangement that may be rotated around the axis of symmetry of the target tube is positioned in the center of the substrate arrangement. The magnet arrangement is then aligned with the respective target, which is connected to the power supply device at the same time.

If substrates that are moved in a linear fashion are to be coated, it can be useful to arrange several magnetron sources in two rows such that their target normals are pointed to the substrate. For this purpose, the switching program is structured in such a way that, at least for portions of the coating time, one or more magnetron sources of the one row are simultaneously working together with one or more magnetron sources of the other row.

In this description, substrate is to be understood fundamentally as the individual substrate as well as the arrangement of several substrates in so-called substrate carriers.

BRIEF DESCRIPTION OF THE DRAWINGS

The invention shall be described in greater detail in the following using four exemplary embodiments.

DETAILED DESCRIPTION OF THE INVENTION

Figure 1:
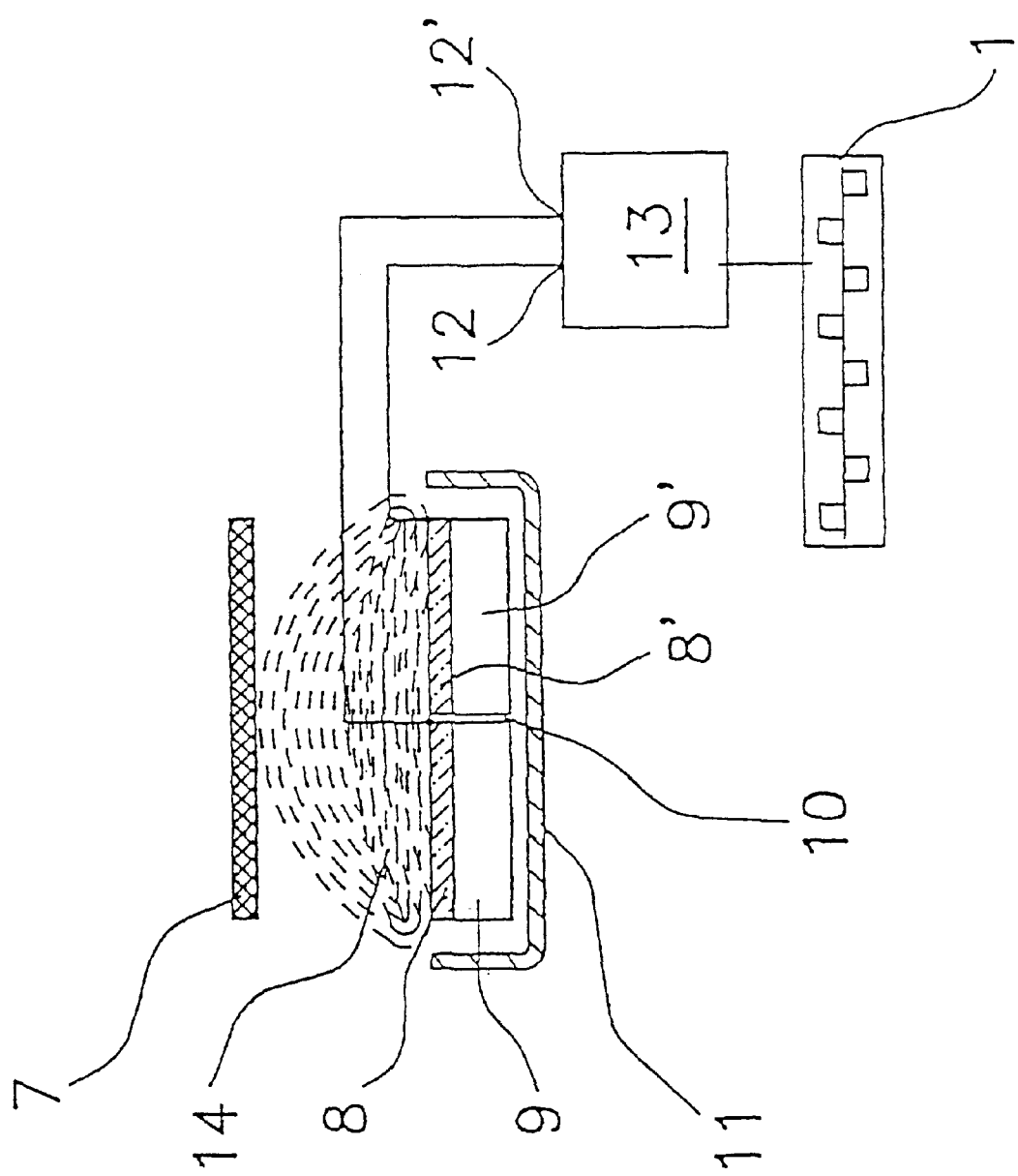
FIG. 1 shows the principle of bipolar pulsed magnetron sputtering using a double magnetron arrangement according to the prior art.

In FIG. 1, the principle of bipolar pulsed magnetron sputtering using a double magnetron arrangement according to the prior art is shown for the purpose of explanation. A double magnetron arrangement is used by way of example for coating the substrate 7. It contains two rectangular targets 8 and 8' with the associated magnet arrangements 9 and 9'. The targets 8 and 8' are arranged parallel to one another and separated from one another by a narrow gap 10. Normally, a double magnetron arrangement is surrounded by a common housing 11. The targets 8 and 8' lie in one plane.

Constructions are also known from the prior art in which the target normals form an angle α<180°. The targets 8 and 8' are each connected to one of the output terminals 12 and 12' of the potential-free bipolar pulsed power supply device 13. After the ignition of a glow discharge, a plasma 14 forms, which is essentially concentrated in the region near the target and in the region of the gap 10 between the targets 8 and 8'. In the program scheme 1 pertaining to the bipolar pulsed power supply device 13, the temporal progression of the bipolar pulsed energy is depicted schematically. If, during the glow discharge and thus during the sputtering, the frequency for the polarity reversal is selected in the preferred range of 10 kHz to 100 kHz, a high degree of process stability is achieved for the magnetron sputtering. This is also true for the reactive deposition of electrically insulating layers. In other frequency ranges, the specific advantages of bipolar pulsed magnetron sputtering are lost.

The disadvantage of solutions according to the prior art lies in the fact that the core region of the plasma 14 forms on the short path between the targets 8 and 8' and it is difficult in practice to bring the substrate close to this region in order to achieve an effective deposition of the material sputtered by the targets 8 and 8' onto the substrates under the influence of a dense plasma.

FIGS. 2 to 5 show various exemplary embodiments using the devices according to the invention.

Exemplary Embodiment I

Figure 2:
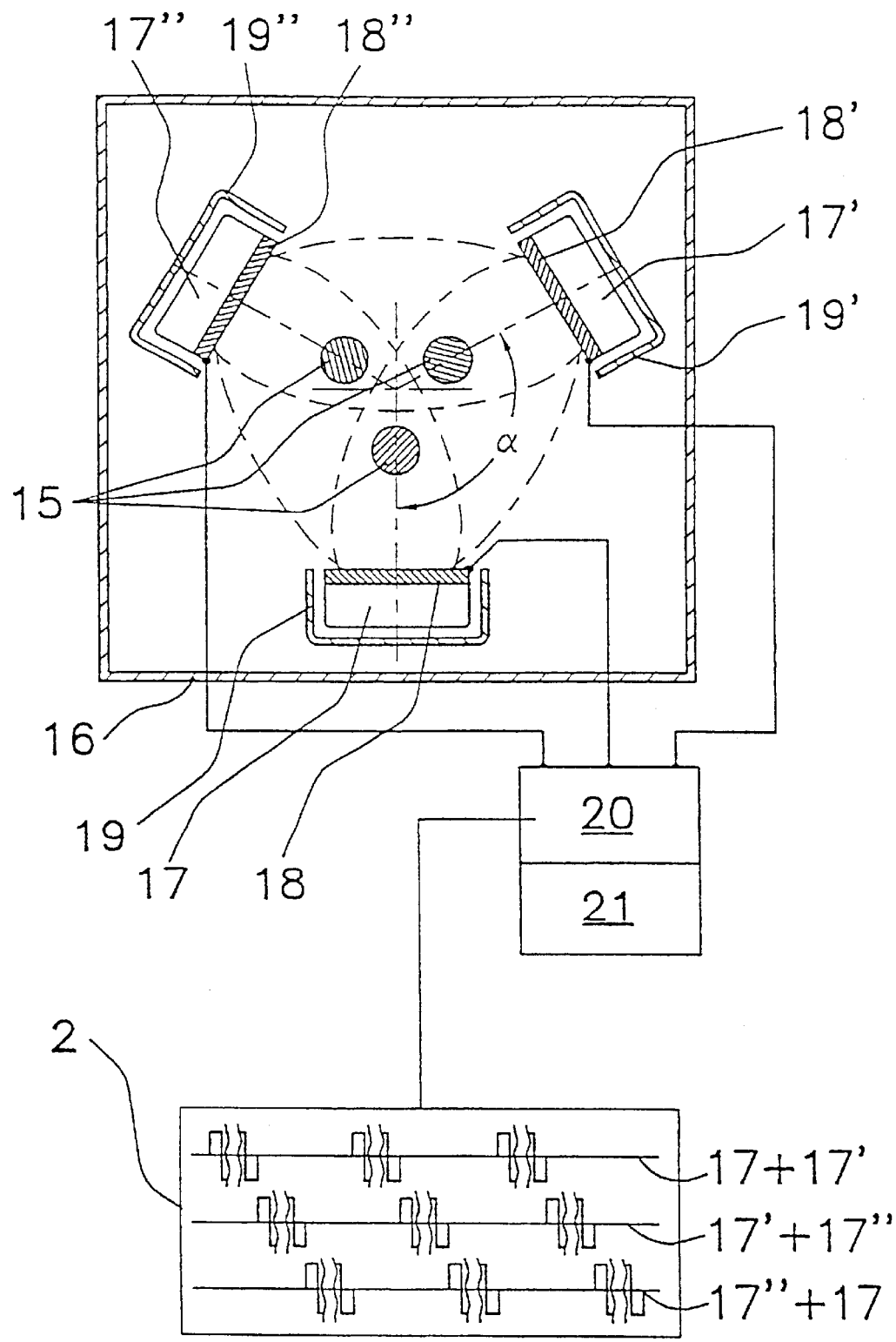
FIG. 2 shows a device according to the invention with three magnetron sources arranged peripherally to the substrates.

FIG. 2 shows a vacuum coating chamber 16 in which the substrates 15 are centrally arranged. Three magnetron sources 17, 17', and 17" with magnet arrangements and metallic targets 18, 18', and 18" are arranged peripherally to the substrates 15. The normals of the targets 18, 18', and 18" are aligned evenly to the substrates 15 and to one another at an angle α of 120°. Each magnetron source 17, 17', and 17" is surrounded by a housing 19, 19', and 19", which achieves dark space yielding. The targets 18, 18', and 18" are electrically connected to a switching device 20. A potential-free bipolar pulsed power supply device 21 serves the purpose of energy supply.

An application of the device described above for coating of the substrate using the process according to the invention shall be described in greater detail in the following.

The reactive bipolar pulse magnetron sputtering occurs using the switching device 20 in such a way that, for certain time periods of the coating process, two of the three magnetron sources 17, 17', and 17" are respectively connected to the terminals of the pulsed power supply device and such that the selection of the magnetron sources 17, 17', 17" and the duration of their joint action is controlled according to a predetermined program. During use, two neighboring magnetron sources 17, 17', and 17" are respectively connected to the power supply device 21 for the duration of one second. At a frequency of polarity reversal of the bipolar pulsed magnetron discharge of 50 Hz, this corresponds to 50,000 polarity reversals. Another combination of two of the three magnetron sources 17, 17', and 17" is then connected to the power supply device 21 for the duration of one second in turn, and so on. The program ensures that each magnetron source 17, 17', and 17" is connected for an equal period when averaged over time. In the exemplary embodiment, in contrast to the use of double magnetron arrangements according to the prior art, the entire space surrounding the substrates 15 is filled with a dense plasma. If a bias is placed on the substrates, a high ionic current (e.g., 10 to 100 mA/cm$^2$) can be extracted. In the program scheme 2, pertaining to the switching direction 20, the temporal progression of the bipolar pulsed current is shown schematically, which is provided by the bipolar pulsed power supply device 21 for the individual magnetron sources 17, 17', and 17" with the targets 18, 18', and 18".

Exemplary Embodiment II

Figure 3:
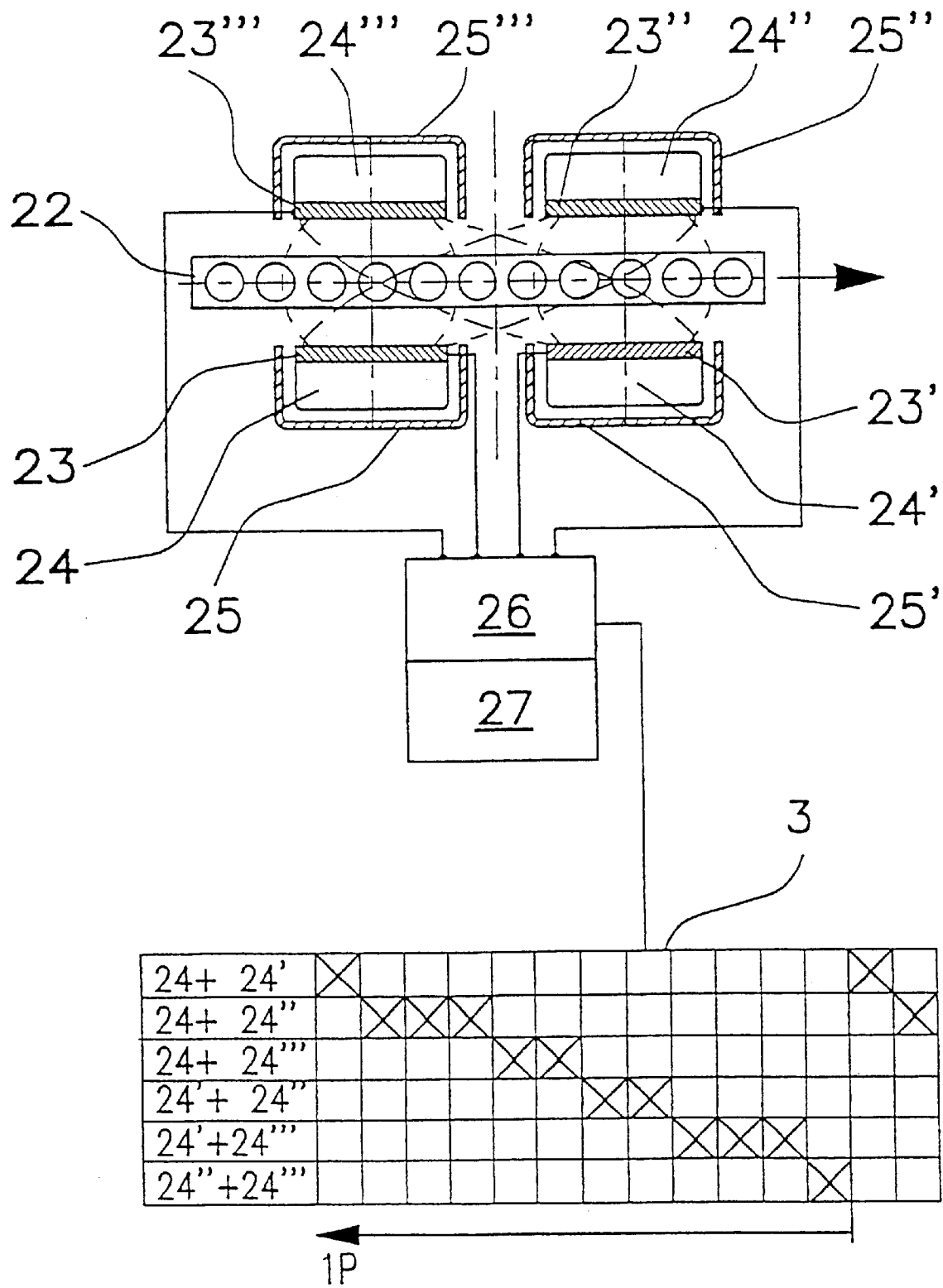
FIG. 3 shows a device according to the invention with four magnetron sources that are arranged in two planes on both sides of the substrates.

In FIG. 3, the invention is explained in detail using the example of bipolar pulsed magnetron sputtering for coating a substrate that is extended in its area. The substrate 22, which is provided with openings, is moved in the direction of the arrow through the coating space between four magnetron sources 24, 24', 24", and 24''' for the purpose of coating.

A reactive bipolar pulsed magnetron discharge is to be performed by way of example. For this purpose, the coating space is filled with an argon-nitrogen mixture. The material to be sputtered is provided in the form of four rectangular plates, which are provided as targets 23, 23', 23", and 23''' at the four magnetron sources 24, 24', 24", and 24'''.

The magnetron sources 24, 24', 24", and 24''' are surrounded by housings 25, 25', 25", and 25'''. The magnetron sources 24 and 24' are arranged in a lower row and the magnetron sources 24", and 24''' are arranged in an upper row. All target normals are pointed at the substrates in a parallel and/or antiparallel manner. The targets 23, 23', 23", and 23''' are thus arranged on both sides of the substrates 22. A switching device 26 connects two of the magnetron sources 24, 24', 24", and 24''' at a time to the output terminals of a bipolar pulsed power supply device 27 for a given duration.

In the program scheme 3, pertaining to the switching direction 26, the temporal progression of the bipolar pulsed current is shown schematically, which is provided by the bipolar pulsed power supply device 27 for the individual magnetron sources 24, 24', 24", and 24''' with the targets 23, 23', 23", and 23'''.

The program scheme 3 clarifies the program for the selection and switching duration of each combination of the magnetron sources 24, 24', 24", and 24'''. A schematically depicted time unit represents 0.1 seconds, so that the program operates with a period duration IP of 1.2 seconds. For the entire coating process this sequence is cycled through 500 times, for example.

Exemplary Embodiment III

Figure 4:
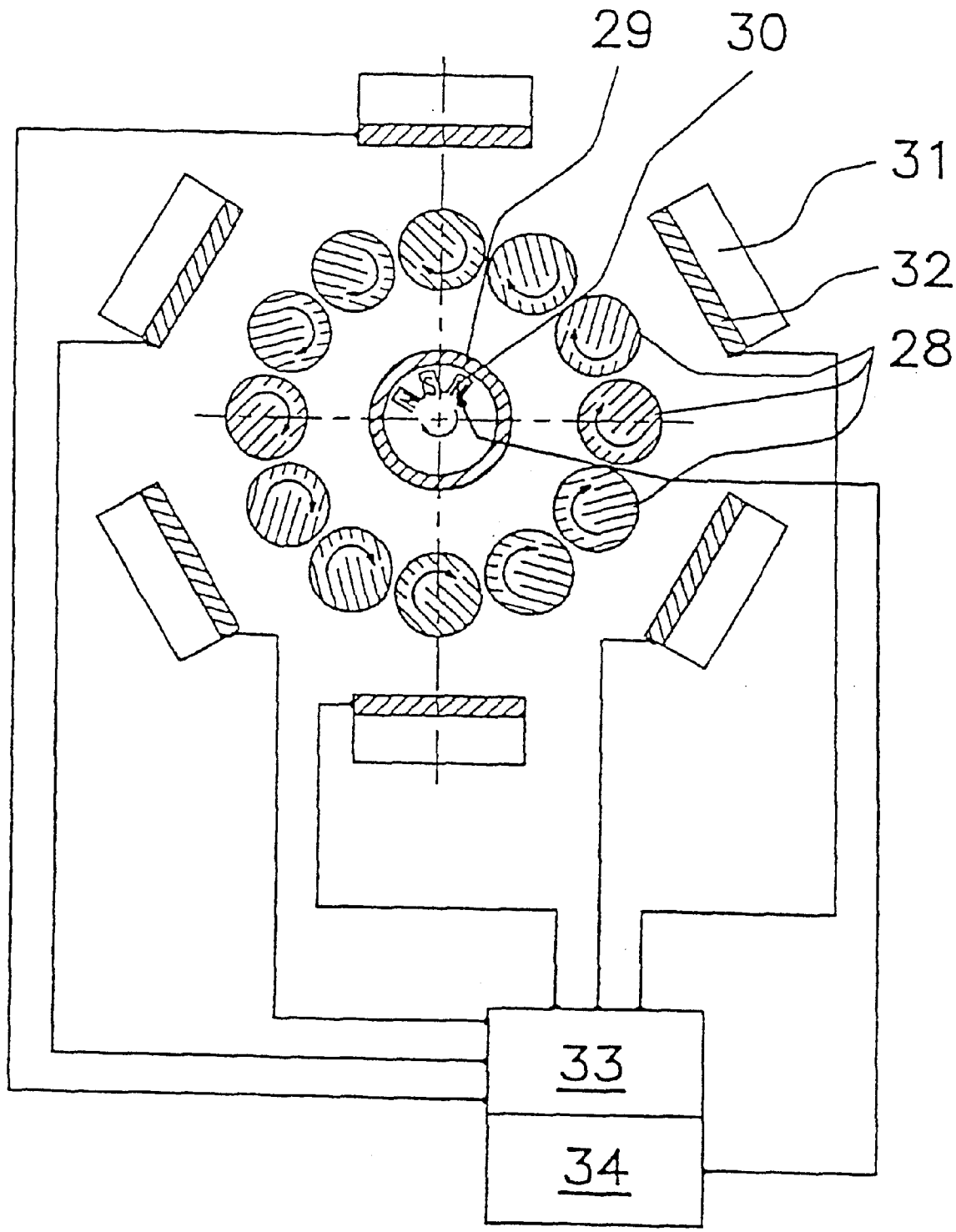
FIG. 4 shows a device with substrates arranged in the shape of a ring, a central magnetron source, and six peripheral magnetron sources.

FIG. 4 shows a device with substrates 28 arranged in the shape of a ring, a central magnetron source with a tube-shaped target 29, and a rotatable magnet arrangement 30 in the interior of the target 29. Six magnetron sources 31 with targets 32 are arranged coaxially and peripherally to the substrates 28.

In the exemplary embodiment, the substrates 28 are located in holders by way of which they are rotated in a planetary manner around the central axis of the arrangement as a whole and around their own axes.

The magnetron arrangement 30 rotates uniformly with a rotational speed of 20 min$^{-1}$ about the central axis of the device. The normals of the targets 32 are oriented toward the center. All outer magnetron sources 31 have an angular distance of 60° from one another.

The power supply of the target 32 is accomplished by a bipolar pulsed power supply device 34 by way of a switching unit 33. Here, for example, the switching unit 33 works with a program in which three neighboring magnetron sources 31 are respectively switched in parallel and are connected to an output terminal of the bipolar pulsed power supply device 34. The central magnetron source with the tube-shaped target 29 is constantly connected to the other output terminal of the power supply device 34.

The program scheme of the switching unit 33 provides for each of the three targets 32 to be connected in parallel manner and to be connected to an output terminal of the power supply device 34 that faces the instantaneous position of the magnet arrangement 30 of the central magnetron source. In this manner, a steam and plasma cloud is produced whose greatest concentration circulates with the rotational speed of the magnet arrangement 30 of the central magnetron source.

Exemplary Embodiment IV

Figure 5:
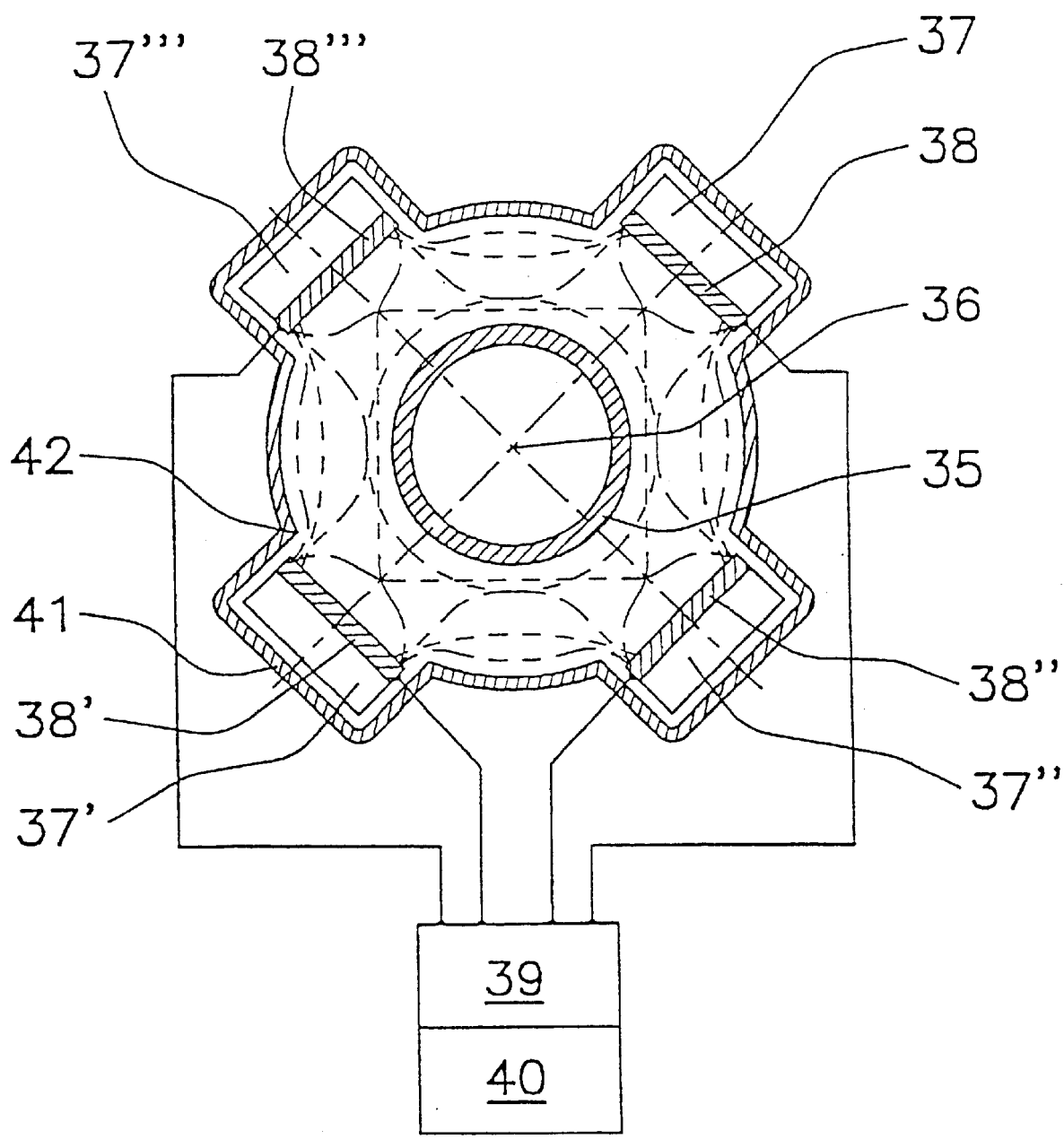
FIG. 5 shows a device for producing a system of several layers on a tube-shaped substrate corresponding to the process according to the invention.

FIG. 5 illustrates a device for depositing a layer system consisting, for example, of three partial layers, using the process according to the invention and a device according to the invention.

A tube 35 is to be provided on its outer side with a layer system that includes the partial layers titanium nitride (TiN), titanium aluminum nitride (TiAlN), and aluminum oxide ($Al_2O_3$). The tube 35 rotates about the axis 36 during coating. The device utilizes two magnetron sources 37 and 37' with the titanium targets 38 and 38' and two magnetron sources 37" and 37'" with the aluminum targets 38" and 38'".

In a first process section, sputtering of the titanium targets 38 and 38' occurs in an argon-nitrogen mixture. By way of the switching device 39, both of the output terminals of the bipolar pulsed power supply device 40 are connected to the titanium targets 38 and 38'. After the necessary thickness of the titanium nitride layer deposited in this process step has been reached, the titanium target 38 and the aluminum target 38" and correspondingly the titanium target 38' and the aluminum target 38'" are respectively connected to the output terminals of the power supply device 40 by the switching device 39 according to the program. Both target pairs are alternately included in the sputtering process in a one-second cycle and equally long on the average over time. After the predetermined layer thickness of the titanium aluminum nitride layer being deposited here has been reached, the process gas is removed and replaced with an argon-oxygen mixture. The switching device now connects the two aluminum targets 38" and 38'" to the output terminals of the power supply device 40 and aluminum oxide is deposited. When the aluminum oxide layer has reached its predetermined thickness, the deposition of the layer system is concluded.

The coating device is surrounded by a system of screen plates 41, which is potential-free. Parts 42 of these screen plates 41 protrude into the space between the targets 38, 38', 38", and 38'" and the tube 35 as the substrate. Because of their geometric form and the resulting electrical field, they contribute to a further increase of the average plasma density in the substrate region. The device described is appropriate for depositing a layer system with the highest degree of quality because the layer formation takes place under intensive plasma activation.

Naturally, the invention is not limited to the exemplary embodiments described. Thus, it is easily possible to change the arrangement of the substrates and the targets relative to one another to a large extent. The number of targets and the respective common switching especially can be changed dramatically. The latter is especially advantageous for producing specific layer systems on the substrates. In the same sense, several bipolar power supply devices and switching devices, each of which acts together with a part of the targets, can also be advantageous.

What is claimed is:

1. A process for coating substrates utilizing bipolar pulsed magnetron sputtering in the frequency range between 10 kHz and 100 kHz in a device which includes at least three targets, the process comprising:

connecting at least two targets at a time to a potential-free bipolar power supply device;

sputtering the at least two targets in a bipolar manner for a predetermined period of time;

changing the connecting of the at least two targets to the bipolar power supply device according to a technologically predetermined program;

arranging the at least two targets relative to the substrates in a manner such that during each reversing discharge, the substrates are located at least partially inside a discharge current between the targets which are active at the time;

creating a region of high plasma density;

locating the substrates essentially in the region of high plasma density; and coating the substrates in the region of high plasma density.

2. The process of claim 1, wherein the changing occurs one of temporally periodically and aperiodically.

3. The process of claim 1, wherein the predetermined period of time comprises at least 10 polarity reversals of a bipolar magnetron discharge.

4. The process of claim 3, wherein the predetermined period of time comprises between 1,000 and 100,000 polarity reversals.

5. The process of claim 1, wherein at least one of a material of the targets and the technologically predetermined program is adapted to a desired layer deposition.

6. The process of claim 1, wherein at least one of a material of the targets and the technologically predetermined program is adapted to a desired coating task.

7. The device of claim 1, wherein the substrates comprise at least one of an optical, an electrical, and a mechanical component or tool.

8. A device for coating substrates utilizing bipolar pulsed magnetron sputtering in the frequency range between 10 and 100 kHz, the device comprising:

at least three magnetron sources;

each of the at least three magnetron sources comprising a target;

at least two of the targets being connected at a time to a potential-free bipolar power supply device;

the at least three targets being arranged relative to the substrates in such a way that the substrates are located at least partially inside a discharge current during a coating of the substrates;

a switching device adapted to connect the targets to the bipolar power supply device; and a technological predetermined program for controlling the switching device, wherein the switching device connects at least two of the targets at a time to the bipolar power supply device according to the technologically predetermined program, wherein a region of high plasma density is created by the targets, wherein the substrates are located essentially in the region of high plasma density, and wherein the substrates are coated in the region of high plasma density.

9. The device of claim 8, wherein the at least three targets comprise at least four targets.

10. The device of claim 9, wherein at least two of the at least four targets are arranged on one side of the substrates and wherein at least two of the at least four targets are arranged on another side of the substrates.

11. The device of claim 8, wherein the at least three targets are arranged to surround the substrates.

12. The device of claim 8, wherein at least one of the at least three targets and the substrates are adapted to be movable.

13. The device of claim 8, wherein the at least three targets comprise four targets, wherein two of the four targets are arranged on opposite sides of the substrates, and wherein one of the two targets on each side of the substrates is adapted to be simultaneously connected to the bipolar power supply device.

14. The device of claim 8, wherein at least one of the at least three targets, which is arranged on one side of the substrates, is constantly connected to the bipolar power supply device and wherein at least two of the at least three targets, which are arranged on another side of the substrates, are changeably connected to the switching device.

15. The device of claim 8, wherein the at least three magnetron sources are spaced aparat such that their corresponding magnetic fields do not significantly influence one another.

16. The device of claim 8, further comprising a device arranged to surround the at least three magnetrons.

17. The device of claim 16, wherein the device arranged to surround the at least three magnetrons comprises one of a grounded screen and potential-free screen.

18. The device of claim 16, wherein the device arranged to surround the at least three magnetrons protrudes into an open area between a target plane and the substrates.

19. The device of claim 8, wherein the substrates comprise at least one of an optical, an electrical, and a mechanical component or tool, and wherein device is adapted to produce one of more decorative of functional layers on the substrates.

20. A device for coating substrates utilizing bipolar pulsed magnetron sputtering in the frequency range between 10 and 100 kHz, the device comprising:

at least three magnetron sources;
   each of the at least three magnetron sources comprising a target;
   at least two of the targets being connected to a potential-free bipolar power supply device;
   the at least three targets being arranged relative to the substrates in such a way that the substrates are located at least partially inside a discharge current during a coating of the substrates;
   a switching device adapted to connect the targets to the bipolar power supply device; and
   a technological predetermined program for controlling the switching device,
      wherein the switching device connects at least two of the targets at a time to the bipolar power supply device according to the technologically predetermined program,
      wherein at least one of the at least three targets comprises a central target which is centrally disposed and at least two of the at least three targets comprise peripheral targets which are peripherally arranged, whereby the substrates are disposed between the central target and the peripheral targets.

21. The device of claim 20, wherein the central target comprises at least one of tube-shaped, connected to the bipolar power supply device, and a central rotatable magnet arrangement.

22. The device of claim 20, wherein the central target is rotatable.

23. A device for coating substrates utilizing bipolar pulsed magnetron sputtering in the frequency range between 10 and 100 kHz, the device comprising:

a bipolar power supply;
   a switching device coupled to the bipolar power supply;
   a program adapted to control the switching device;
   at least three magnetron sources;
   at least two of the at least three magnetron sources being coupled to the switching device;
   at least one of the at least three magnetron sources being coupled to one of the switching device and the bipolar power supply;
   each of the at least three magnetron sources comprising a target;
      wherein the switching device connects at least two of the targets at a time to the bipolar power supply according to the program,
      wherein a region of high plasma density is created by the targets, wherein the substrates are located essentially in the region of high plasma density, and wherein the substrates are coated in the region of high plasma density.

\* \* \* \* \*